(12) United States Patent
Kwon et al.

(10) Patent No.: US 7,948,814 B2
(45) Date of Patent: May 24, 2011

(54) SEMICONDUCTOR MEMORY DEVICE

(75) Inventors: Dae-Han Kwon, Kyoungki-do (KR); Kyung-Hoon Kim, Kyoungki-do (KR); Taek-Sang Song, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 339 days.

(21) Appl. No.: 12/164,797

(22) Filed: Jun. 30, 2008

(65) Prior Publication Data

US 2009/0279378 A1    Nov. 12, 2009

(30) Foreign Application Priority Data

May 6, 2008   (KR) .......................... 10-2008-0041662

(51) Int. Cl.
*G11C 7/00* (2006.01)
(52) U.S. Cl. ................ 365/191; 365/233.1; 365/233.11; 365/233.13
(58) Field of Classification Search .................. 365/191, 365/233.1, 233.13, 233.11
See application file for complete search history.

(56) References Cited

U.S. PATENT DOCUMENTS

| | | | | |
|---|---|---|---|---|
| 5,901,110 A | * | 5/1999 | Jang .......................... | 365/233.12 |
| 6,377,512 B1 | * | 4/2002 | Hamamoto et al. ...... | 365/233.17 |
| 7,075,853 B2 | * | 7/2006 | Jeong et al. .............. | 365/189.15 |
| 2009/0161445 A1 | * | 6/2009 | Lee ........................... | 365/189.05 |

FOREIGN PATENT DOCUMENTS

| | | |
|---|---|---|
| KR | 1020050099773 A | 10/2005 |
| KR | 1020070101412 A | 10/2007 |

OTHER PUBLICATIONS

Notice of Allowance issued from Korean Intellectual Property Office on May 27, 2009 with an English Translation.

* cited by examiner

*Primary Examiner* — Pho M Luu
(74) *Attorney, Agent, or Firm* — IP & T Group LLP

(57) ABSTRACT

A semiconductor memory device including a clock input for receiving a source clock and supplying a generated clock to a plurality of clock transmission lines; a plurality of clock amplifiers, each amplifying a respective generated clock loaded on one of the plurality of clock transmission lines in response to a column enable signal; and a data input/output for inputting/outputting a plurality of data in response to the amplified clocks output by the plurality of clock amplifiers.

15 Claims, 3 Drawing Sheets

SEMICONDUCTOR MEMORY DEVICE

CROSS-REFERENCE(S) TO RELATED APPLICATIONS

This application claims priority of Korean patent application number 10-2008-0041662, filed on May 6, 2008, which is incorporated by reference in its entirety.

BACKGROUND OF THE INVENTION

The subject matter relates to a semiconductor memory device, and more particularly, to a method for transmitting a clock for inputting/outputting data inside a semiconductor memory device. Especially, the subject matter relates to a semiconductor memory device for minimizing the power consumption of transmitting a clock for inputting/outputting data at a relatively high frequency.

In general, a semiconductor memory device stores data and inputs/outputs data if necessary. That is, if a device for controlling input/output of data, such as a memory control unit (MCU) or a central processing unit (CPU), requests the semiconductor memory device to perform a data input/output operation, the semiconductor memory device outputs stored data in response to an address from the device or stores data provided by the device, at a location corresponding to the address.

Meanwhile, as the operating speed of a system including a semiconductor memory device has gradually increased and the technology of integrating a semiconductor has rapidly advanced, semiconductor memory devices have been required to output and store more data at greater speed.

In order to input/output data at a high speed, a synchronous DRAM (SDRAM) was introduced. The SDRAM inputs and outputs data by synchronizing with an external clock.

Also, a double data rate (DDR) SDRAM was introduced to input/output data at a further faster speed than the SDRAM. The DDR SDRAM outputs and inputs data not only on a rising edge but also on a falling edge of a system clock, whereas the SDRAM inputs and outputs data only on a rising edge of a system clock.

Accordingly, the DDR synchronous semiconductor memory device must process two data in one cycle of a system clock because it needs to input and output data on both a rising edge and a falling edge of a system clock. That is, the DDR synchronous semiconductor memory device outputs data or inputs and stores data at a rising edge and a falling edge of a clock applied from an external device.

Therefore, a data input timing and a data output timing of the DDR synchronous semiconductor memory device must be accurately synchronized with a rising edge or a falling edge of a system clock in order to perform a data input/output operation without error.

Accordingly, the DDR synchronous memory device internally includes an independent data output circuit for controlling a data output timing and a data transferring timing in order to output data synchronized with the rising and falling edge of a system clock.

However, the DDR synchronous semiconductor memory device according to the related art could not satisfy the need for inputting/outputting a large amount of data at a high speed. In order to overcome such a shortcoming, a synchronous semiconductor memory device uses following two methods for increasing a data input/output speed, lately.

A first method increases a speed of transferring an address inputted to a device for controlling data input/output operations, for example, a memory control unit (MCU) or a central processing unit (CPU).

For example, a lately developed high speed synchronous semiconductor memory device receives addresses synchronized with a rising edge and a falling edge of a clock applied from an external device although a typical DDR synchronous semiconductor memory device receives an address synchronized with a rising edge of a clock applied from an external device.

That is, the lately developed high speed synchronous semiconductor memory device receives two addresses in a cycle of an external clock from a device requesting a data input/output operation, that is, at a rising edge and a falling edge of the external clock, and performs a related internal operation, although the typical DDR synchronous semiconductor memory device receives an address in a cycle of a clock applied from a device requesting a data input/output operation, that is, at a rising edge, and performs an internal operation.

Therefore, the lately developed high speed synchronous semiconductor memory device according to the first method was designed to receive addresses not only on a rising edge but also on a falling edge of a system clock applied from an external device. Such a high speed synchronous semiconductor memory device offers the following advantages.

First, two addresses can be received in one cycle of a system clock. The high speed synchronous semiconductor memory device can receive the same number of address signals that the DDR synchronous memory receives, although the high speed synchronous semiconductor memory device includes half the number of input pads for receiving addresses compared with a typical DDR synchronous memory device. Therefore, the lately developed high speed synchronous memory device according to the first method occupies a smaller area than the DDR synchronous memory device while performing the same operation of the DDR synchronous memory device.

Secondly, the lately developed high speed synchronous memory device according to the first method can use redundant input pads, which are not used to receive addresses, to receive a power voltage VDD or a ground voltage VSS. Therefore, the lately developed high speed synchronous memory device can perform operations more stably because the power voltage VDD and the ground voltage VSS can be more stably received.

Thirdly, if the lately developed high speed semiconductor memory device according to the first method uses all of input pads for receiving addresses in a DDR synchronous semiconductor memory device and controls them to receive two addresses in one cycle of a system clock, the device can receive twice as many addresses as the typical DDR synchronous semiconductor memory device receives in one cycle of a system clock. Therefore, the lately developed high speed synchronous semiconductor memory device according to the first method can have twice of the memory capacity for inputting and outputting data as compared to a typical DDR synchronous semiconductor memory device.

A second method further increases the number of data input and output in one cycle of a system clock.

For example, a lately developed high speed synchronous semiconductor memory device according to the second method inputs and outputs data four times in one cycle of a system clock, that is, two times at each of a rising edge and a falling edge, in contrast with a DDR synchronous semiconductor memory device that inputs and outputs data twice in one cycle of a system clock, that is, at a rising edge and a falling edge.

The lately developed high speed synchronous semiconductor device according to the second method must be designed to input/output two data between a rising edge and a falling edge of a system clock applied from an external device and to input/output another two data between the falling edge and a next rising edge.

However, it is necessary to have a data clock having a double that of a system clock in order to input/output four data in one cycle of the system clock because the system clock only can express two states: logical high and logical low. That is, the lately developed high speed synchronous semiconductor memory device according to the second method must have a dedicated clock for a data input/output operation in order to perform the second method.

Therefore, the lately developed high speed synchronous semiconductor memory device according to the second method controls overall operations by receiving an address and a command based on a system clock of a predetermined frequency and inputs/outputs data based on a data clock having a frequency double that of the system clock.

For example, two cycles of the data clock are repeated in one cycle of the system clock, and a data input/output operation is performed at each of a rising edge and a falling edge of the data clock so as to allow four data to be inputted/outputted in one cycle of the system clock.

That is, unlike a typical DDR synchronous semiconductor memory device which uses one system clock as a reference to perform a read operation and a write operation, the lately developed high speed synchronous semiconductor memory device according to the second method exchanges data using two clocks each having a different frequency to perform a read operation and a write operation.

Considering the two above methods for increasing the data input/output speed, the first method increases a speed of transferring an address input to the synchronous semiconductor memory device in a device for controlling a data input/output operation such as a memory control unit (MCU) or a central processing unit (CPU). Since the first method enables a high speed synchronous semiconductor memory device to operate in response to an address input at a fast speed, it is not necessary to significantly modify the design and operation of the typical high speed synchronous semiconductor memory device to embody the first method.

However, since the number of clocks applied to a synchronous semiconductor memory device according to the second method is increased from one to two, that is, from a system clock to a system clock and a data clock, it is necessary to add a new transmission path for a data clock for inputting/outputting data while addresses and commands are continuously input in synchrony with the system clock. That is, it is necessary to add a new clock transmission line, which was not included in a typical DDR synchronous semiconductor memory device, to the lately developed high speed semiconductor memory device according to the second method.

FIG. 1 is a circuit diagram illustrating a data clock transmission path according to the related art for a synchronous semiconductor memory device operating at a high speed.

Referring to FIG. 1, a data clock transmission path according to the related art in the lately developed high speed synchronous semiconductor memory device includes a clock input unit 100, a plurality of clock repeaters 120A, 120B, 120C, and 120D, data input/output units 160A, 160B, 160C, and 160D, and clock transmission controllers 140A, 140B, 140C, and 140D. The clock input unit 100 receives clocks CLK and CLKB from an external device and supplies the received clocks to a plurality of clock transmission lines LINE_A, LINEB_A, LINE_B, LINEB_B, LINE_C, LINEB_C, LINE_D, LINEB_D as internal clocks IN_CLK and IN_CLKB. The plurality of clock repeaters 120A, 120B, 120C, and 120D are connected to each of the clock transmission lines LINE_A, LINEB_A, LINE_B, LINEB_B, LINE_C, LINEB_C, LINE_D, and LINEB_D) in series and relay the internal clocks IN_CLK and IN_CLKB. The data input/output units 160A, 160B, 160C, and 160D input and output a plurality of data in response to the clocks loaded on each of the clock transmission lines LINE_A, LINEB_A, LINE_B, LINEB_B, LINE_C, LINEB_C, LINE_D, and LINEB_D. The clock transmission controllers 140A, 140B, 140C, and 140D control transferring clocks loaded on each of the clock transmission lines LINE_A, LINEB_A, LINE_B, LINEB_B, LINE_C, LINEB_C, LINE_D, and LINEB_D to the data input/output units 160A, 160B, 160C, and 160D in response to column enable signals RD_EN and WR_EN.

The clock input unit 100 includes a clock buffer 104, an internal clock generator 106, and a clock driving unit 108. The clock buffer 104 receives clocks CLK and CLKB from an external device through clock input pads 101 and 102 and buffering the received clocks CLK and CLKB. The internal clock generator 106 generates the internal clock IN_CLK and IN_CLKB having the same frequency of a clock applied from an external device in response to the output clock CLK_BUF of the clock buffer 104. The clock driving unit 108 drives the internal clocks IN_CLK and IN_CLKB on each of the clock transmission lines LINE_A, LINEB_A, LINE_B, LINEB_B, LINE_C, LINEB_C, LINE_D, and LINEB_D.

A plurality of the clock repeaters 120A, 120B, and 120C, 120D includes the even number of serially connected inverters INV1_A, INV2_A, INTB1_A, INVB2_A, INV1_B, INV2_B, INTB1_B, INVB2_B, INV1_C, INV2_C, INTB1_C, INVB2_C, INV1_D, INV2_D, INTB1_D, and INVB2_D.

Also, the clock transmission controllers 140A, 140B, 140C, and 140D includes a plurality of first NAND gates NANDW_A, NANDBW_A, NANDW_B, NANDBW_B, NANDW_C, NANDBW_C, NANDW_D, and NANDBW_D, a plurality of first inverters INVW_A, INVBW_A INVW_B, INVBW_B, INVW_C, INVBW_C, INVW_D, and INVBW_D, a plurality of second NAND gates NANDR_A, NANDBR_A, NANDR_B, NANDBR_B, NANDR_C, NANDBR_C, NANDR_D, and NANDBR_D, and a plurality of second inverters INVR_A, INVBR_A, INVR_B, INVBR_B, INVR_C, INVBR_C, INVR_D, and INVBR_D. The plurality of first NAND gates NANDW_A, NANDBW_A, NANDW_B, NANDBW_B, NANDW_C, NANDBW_C, NANDW_D, and NANDBW_D respectively receive a clock loaded on one of the clock transmission lines LINE_A, LINEB_A, LINE_B, LINEB_B, LINE_C, LINEB_C, LINE_D, and LINEB_D as a first input, receive a write enable signal WR_EN between the column enable signal RD_EN and WR_EN as a second input, perform a NAND operation on the received clock and the received write enable signal WR_EN, and output the NAND operation result. The plurality of first inverters INVW_A, INVBW_A INVW_B, INVBW_B, INVW_C, INVBW_C, INVW_D, and INVBW_D respectively receive the output clocks of the first NAND gates NANDW_A, NANDBW_A, NANDW_B, NANDBW_B, NANDW_C, NANDBW_C, NANDW_D, and NANDBW_D, reverse a phase of the received clock, and output the reversed clock. The plurality of second NAND gates NANDR_A, NANDBR_A, NANDR_B, NANDBR_B, NANDR_C, NANDBR_C, NANDR_D, and NANDBR_D respectively receive a clock loaded one of the clock transmission lines LINE_A, LINEB_A, LINE_B, LINEB_B, LINE_C, LINEB_C, LINE_D, and LINEB_D as a first input, receive a read enable signal RD_EN between the column enable signals RD_EN and WR_EN as a second input, perform a NAND operation on the first input and the second input, and output the NAND operation result. The plurality of second inverters INVR_A, INVBR_A, INVR_B, INVBR_B, INVR_C, INVBR_C, INVR_D, and INVBR_D respectively receive output clocks of the second NAND gates NANDR_A, NANDBR_A, NANDR_B, NANDBR_B, NANDR_C, NANDBR_C, NANDR_D, and NANDBR_D, invert the phases of the received clocks, and output the inverted clocks.

Each of the data input/output unit 160A, 160B, 160C, and 160D includes a data input unit RX and a data output unit TX. The data input unit TX loads a plurality of data DATA_0, DATA_1, DATA_2, DATA_3, DATA_4, DATA_5, DATA_6, DATA_7, DATA_8, DATA_9, DATA_10, DATA_11, DATA_12, DATA_13, DATA_14, and DATA_15 input through a plurality of data input/output pads DQ0, DQ1, DQ2, DQ3, DQ4, DQ5, DQ6, DQ7, DQ8, DQ9, DQ10, DQ11, DQ12, DQ13, DQ14, and DQ15 on a global data line GIO in response to output clocks from the plurality of inverters INVW_A, INVBW_A INVW_B, INVBW_B, INVW_C, INVBW_C, INVW_D, and INVBW_D. The data output unit TX outputs a plurality of output data DATA_0, DATA_1, DATA_2, DATA_3, DATA_4, DATA_5. DATA_6, DATA_7, DATA_8, DATA_9, DATA_10, DATA_11, DATA_12, DATA_13, DATA_14, and DATA_15 loaded on the global data line GIO to the plurality of data input/output pads DQ0, DQ1, DQ2, DQ3, DQ4, DQ5, DQ6, DQ7, DQ8, DQ9, DQ10, DQ11, DQ12, DQ13, DQ14, and DQ15 in response to output clocks of the plurality of second inverters INVR_A, INVBR_A INVR_B, INVBR_B, INVR_C, INVBR_C, INVR_D, and INVBR_D.

Hereinafter, the operation of a data clock transmission path according to the related art of the lately developed high speed synchronous semiconductor memory device will be described.

First, the clock input unit 100 supplies clocks CLK and CLKB input from an external device to a plurality of clock transmission lines LINE_A, LINEB_A, LINE_B, LINEB_B, LINE_C, LINEB_C, LINE_D, and LINEB_D. Coming from the external device, a main clock CLK and a sub clock CLKB having an contrary phase from the main clock are received using two clock input pads 101 and 102 as shown in FIG. 1. Although it is not shown in FIG. 1, alternatively one clock with a predetermined frequency and a predetermined phase may be received using one clock input pad.

For example, if the external clocks CLK and CLKB input from the external device have relatively high frequencies, a phase of the external clock is significantly changed by jitter between a device for generating the external clocks CLK and CLKB and the clock input unit 100 of the semiconductor memory device, even though only a small amount of jitter is generated at the external clocks CLK and CLKB due to noise in transferring the external clocks CLK and CLKB. The impact is pronounced because one cycle period of the external clocks CLK and CLKB has a relatively small value because the clock has the relatively higher frequency. As a result, an original duty ratio or an original frequency of the external clocks CLK and CLKB is disadvantageously changed.

It is possible to prevent the original duty ratio and the original frequency of the external clocks CLK and CLKB from being changed, by inputting a main clock CLK and a sub clock CLKB having contrary phases to each other and the same frequency. Although a small amount of jitter is generated at the external clocks CLK and CLKB due to noise in transferring the external clocks CLK and CLKB, a main clock CLK is corrected by a sub clock CLKB having contrary phases and the same frequency with the main clock CLK.

If the external clocks CLK and CLKB input from an external device are have a relatively low frequency, the phases thereof are not as significantly changed between a device for generating the external clocks CLK and CLKB and the clock input unit 100 of the semiconductor memory device by jitter although jitter is generated at the external clocks CLK and CLKB due to noise in transferring the external clocks CLK and CLKB. The effect of the jitter is diminished because one cycle period of the external clocks CLK and CLKB has a relatively large value due to the relatively low frequency. Therefore, an original duty ratio or an original frequency of the external clocks CLK and CLKB are not as easily changed.

Therefore, it is not necessary to simultaneously receive the main clock CLK and the sub clock CLKB having contrary phases to each other and the same frequency as shown in FIG. 1. That is, it is enough to receive one clock having a predetermined phase and a predetermined frequency.

Although the external clocks CLK and CLKB input from the external device have the relatively high frequency, it is not necessary to simultaneously receive the main clock CLK and the sub clock CLKB as shown in FIG. 1. Although the clocks CLK and CLKB input from the external device have a relatively low frequency, it is also not necessary to receive only one clock. That is, it is optional according to a choice made by a designer.

The internal clock generator 106 is a phase locked loop (PLL). The internal clock generator 106 generates internal clocks IN_CLK and IN_CLKB using a buffering clock CLK_BUF provided via the external clock buffer 104 as a reference clock.

The operation of the internal clock generator 106 will be described. As described above, the clocks CLK and CLKB input from an external device have jitter generated due to noise. Here, the generated jitter component remains and is buffered although the external clocks CLK and CLKB are buffered through the external buffer 104 and output as an buffering clock CLK_BUF.

If the buffering clock CLK_BUF having a jitter component is applied to the data input unit RX and the data output unit TX without removing the jitter component and if the data input/output operation is performed based on the buffering clock CLK_BUF having the jitter component, data input/output errors may be disadvantageously generated.

For example, the larger the jitter component is, the smaller a setup/hold margin becomes when data is input through the data input unit RX. Therefore, invalid data may be received. When data is output through the data output unit TX, a data eye becomes reduced, where the data eye is a scale that denotes a period of valid data. Therefore, a receiver of the other semiconductor device such as a memory control unit (MCU) or a central processing unit (CPU) may have difficulty in properly receiving data.

Therefore, internal clocks CLK and CLKB having the same frequency as the buffering clock CLK_BLF, but without the jitter component which was included in the buffering clock CLK_BUF, are generated by performing a phase locked loop (PLL) operation using the buffering clock CLK_BUF as a reference clock, instead of directly using the buffering clock CLK_BUF having the jitter component for a data input/output operation.

Here, the number of the internal clocks IN_CLK and IN_CLKB generated in the internal clock generator 106 may differ according to choices made by a designer. For example, two internal clocks IN_CLK and IN_CLKB having a contrary phase from each other, that is, a phase difference of 180°, may be generated as shown in FIG. 1. Although it is not shown in FIG. 1, four internal clocks each having a phase difference of 90° may be generated. That is, the internal clocks may be divided based on a multi-phase scheme.

As the frequencies of the external clocks CLK and CLKB increase, it is better to divide the internal clocks based on a multi-phase scheme. This is because a clock phase may be greatly influenced even by small jitter component when the clock has relatively high frequency, as described above. The jitter component may be generated while a clock is transmitted inside a semiconductor memory device. A clock having a relatively high frequency is greatly influenced by the jitter component. As a consequence, the phase thereof may be distorted.

Therefore, performing predetermined operations at edges of a clock having a relatively low frequency may be equivalent to performing predetermined operations at edges of a clock having a relatively high frequency, if the internal clocks IN_CLK and IN_CLKB are embodied based on a plurality of clocks where the plurality of clocks have a relatively low frequency with predetermined phase differences of multi-phase scheme. The clocks may not be adversely affected by jitter in the low frequency although the jitter is generated. Whereby, the predetermined operations at edges of a clock include a data input/output and the predetermined phase differences include 180°, 90°, and 45°.

A designer may select whether the internal clocks IN_CLK and IN_CLKB are divided in a multi-phase scheme or not. For example, when external clocks CLK and CLKB have a relatively low frequency, it is not necessary to generate the internal clocks in a multi-phase scheme.

The clock driving unit 108 loads the internal clocks IN_CLK and IN_CLKB generated from the internal clock generator 106 on each of the clock transmission lines LINE_A, LINEB_A, LINE_B, LINEB_B, LINE_C, LINEB_C, LINE_D, and LINEB_D. The data input unit RX and the data output unit TX connected to the data input/output pads DQ0, DQ1, DQ2, DQ3, DQ4, DQ5, DQ6, DQ7, DQ8, DQ9, DQ10, DQ11, DQ12, DQ13, DQ14, and DQ15 perform data input/output operations in response to the internal clocks IN_CLK and IN_CLKB.

That is, the data input unit RX and the data output unit TX are enabled to perform data input/output operations by loading the internal clocks IN_CLK and IN_CLKB on each of the transmission lines LINE_A, LINEB_A, LINE_B, LINEB_B, LINE_C, LINEB_C, LINE_D, and LINEB_D and transmitting the loaded internal clocks IN_CLK and IN_CLKB to the data input RX and the data output unit TX connected to each of the data input/output pads DQ0, DQ1, DQ2, DQ3, DQ4, DQ5, DQ6, DQ7, DQ8, DQ9, DQ10, DQ11, DQ12, DQ13, DQ14, and DQ15.

A plurality of clock repeaters 120A, 120B, 120C, and 120D repeat the internal clocks IN_CLK and IN_CLKB loaded on each of the clock transmission lines LINE_A, LINEB_A, LINE_B, LINEB_B, LINE_C, LINEB_C, LINE_D, and LINEB_D. As shown in FIG. 1, the data input/output pads DQ0, DQ1, DQ2, DQ3, DQ4, DQ5, DQ6, DQ7, DQ8, DQ9, DQ10, DQ11, DQ12, DQ13, DQ14, and DQ15 spread out to the four corners of the synchronous semiconductor memory device. A distance from the clock input unit 100 to each of the data input/output pads DQ0, DQ1, DQ2, DQ3, DQ4, DQ5, DQ6, DQ7, DQ8, DQ9, DQ10, DQ11, DQ12, DQ13, DQ14, and DQ15 becomes relatively long, thereby attenuating an electric potential level while the internal clocks IN_CLK and IN_CLKB pass the clock transmission lines LINE_A, LINEB_A, LINE_B, LINEB_B, LINE_C, LINEB_C, LINE_D, and LINEB_D. The clock repeaters 120A, 120B, 120C, and 120D prevent the electric potential level of the internal clocks from being overly attenuated.

That is, if the internal clocks IN_CLK and IN_CLKB are not repeated, the electric potential level of the internal clocks IN_CLK and IN_CLKB become too attenuated where the internal clocks IN_CLK and IN_CLKB arrive at the data input unit RX and the data output unit TX connected to each of the data input/output pads DQ0, DQ1, DQ2, DQ3, DQ4, DQ5, DQ6, DQ7, DQ8, DQ9, DQ10, DQ11, DQ12, DQ13, DQ14, and DQ15 because the lengths of the plurality of clock transmission lines LINE_A, LINEB_A, LINE_B, LINEB_B, LINE_C, LINEB_C, LINE_D, and LINEB_D are relatively long. Therefore, without the repeaters an error may be generated when a data input/output operation is performed.

Although FIG. 1 shows that each of the clock repeaters 120A, 120B, 120C, and 120D includes two of inverters INV1_A, INV2_A, INTB1_A, INVB2_A, INV1_B, INV2_B, INTB1_B, INVB2_B, INV1_C, INV2_C, INTB1_C, INVB2_C, INV1_D, INV2_D, INTB1_D, INVB2_D connected in pairs in series and connected to each of the clock transmission lines LINE_A, LINEB_A, LINE_B, LINEB_B, LINE_C, LINEB_C, LINE_D, and LINEB_D, additional inverters may be included at the middle of the clock transmission line to compensate for the length of each clock transmission line LINE_A, LINEB_A, LINE_B, LINEB_B, LINE_C, LINEB_C, LINE_D, and LINEB_D. As a result, more inverters may be included in each of the clock transmission lines LINE_A, LINEB_A, LINE_B, LINEB_B, LINE_C, LINEB_C, LINE_D, and LINEB_D than those shown in FIG. 1.

The clock transfer controllers 140A, 140B, 140C, and 140D control a clock loaded on each of the clock transmission lines LINE_A, LINEB_A, LINE_B, LINEB_B, LINE_C, LINEB_C, LINE_D, and LINEB_D to be transferred to the data input/output units 160A, 160B, 160C, and 160D in response to column enable signals RD_EN and WR_EN. The data input unit RX and the data output unit TX share each of the data input/output pads DQ0, DQ1, DQ2, DQ3, DQ4, DQ5, DQ6, DQ7, DQ8, DQ9, DQ10, DQ11, DQ12, DQ13, DQ14, and DQ15.

Since input data and output data are corrupted if data is input or output simultaneously to/from one of the data input/output pads DQ0, DQ1, DQ2, DQ3, DQ4, DQ5, DQ6, DQ7, DQ8, DQ9, DQ10, DQ11, DQ12, DQ13, DQ14, and DQ15, the clock transfer controllers act to not input the clock to the data input unit RX and the data output unit TX at the same time.

Such a data clock transmission path according to the related art is adapted in a lately developed high speed synchronous semiconductor memory device. However, the lately developed high speed synchronous semiconductor memory device has the following problems due to the data clock transmission path according to the related art.

First, the lately developed high speed semiconductor memory device has a data clock having a frequency relatively higher than a system clock. For example, the external clocks CLK and CLKB and the internal clocks IN_CLK and IN_CLKB have a frequency about double that of the system clock. That is, the lately developed high speed semiconductor memory device has the high frequency for transmitting a large amount of data at high speed.

Also, in general, the higher the frequency of a clock is, the more current is wasted via the clock transmission path when the clock is transmitted through the clock transmission path.

Since the data clock of the lately developed high speed semiconductor memory device has a relatively high frequency, the amount of current wasted in the clock transmission path is accordingly increased.

Additionally, the amount of jitter generated in a clock is proportional to the amount of the current wasted in a clock transmission path when the clock is transmitted through the clock transmission path. This is because a fluctuation width of an electric potential level of the clock becomes wider as the amount of current wasted in the path increases. Since the lately developed high speed semiconductor memory device uses the data clock having the relatively high frequency and accordingly a large amount of current is wasted to transmit the data clock, it is expected that a correspondingly large jitter will be generated in the data clock while transmitting the data clock.

As described above, the higher the frequency of a clock is, the more the amount of current is wasted when a clock is transmitted through a predetermined path. The reason thereof will be described in more detail as follows. First, it is because the frequency of a clock is relatively high. Because the clock signal needs to more frequently perform toggling, more current is wasted. Second, the amount of wasted current increases in relation to the number of CMOS transistors that the clock needs to pass when the clock is transmitted.

That is, an amount of current wasted when a clock passes through a predetermined path may be defined as the sum of a power consumption amount dependent on the frequency of a clock and another power consumption amount dependent on the number of CMOS transistors that a clock passes when the clock passes through a path.

The data clock transmission path according to the related art includes a plurality of repeaters 120A, 120B, 120C, and 120D for repeating the data clock such as the external clocks CLK and CLKB and the internal clocks IN_CLK and IN_CLKB for preventing the attenuation of the data clock.

That is, the data clock must pass through a plurality of repeaters in the data clock transmission path according to the related art in the lately developed high speed semiconductor memory device. Thus, a predetermined amount of current is wasted at each of inverters included in each of the repeaters when the data clock passes through each of the repeaters, and the size of jitter generated in the data clock increases as a result.

Also, the number of operations performed in each of the inverters included in each repeater increases as the frequency of the data clock increases. Therefore, each of the repeaters uses even more current, and the size of jitter generated in the data clock increases further.

When the data clock is transmitted using the data clock transmission path according to the related art in the lately developed high speed semiconductor memory device, if the frequency of the data clock is higher than 1 GHz, approximately 40% of the total power consumption of a semiconductor memory device is used for transmitting the data clock. Accordingly, the probability of data input/output error occurrence increases when data input/output operations are performed because the amount of jitter generated in the data clock is further increased due to the increase in power consumption.

Even in a device in which a data clock has a reduced frequency because the data clock is divided according to a multi-phase scheme in the lately developed high speed semiconductor memory device, a predetermined amount of current is wasted by the data clock passing through the repeaters. Therefore, jitter may be generated even for each of the data clocks generated by the multi-phase scheme. However, the phase of the data clock may be not significantly changed by the jitter generated in the data clock because the frequencies of the data clocks generated in the multi-phase scheme are relatively low.

The data clocks generated in the multi-phase scheme are input to one of data output units TX or data input units RX with a predetermined phase difference. As shown in FIG. 1, the main internal clock IN_CLK and the sub internal clock IN_CLKB are inputted to each of the data output unit TX and each of the data input units RX at the same time. However, if devices including the repeaters for repeating the main internal clock IN_CLK do not have the same size, jitter generated in each of the data clocks may cause unpredictable phase variation. In the worst case, jitter that reacts in an opposite direction may be generated between adjacent data clocks, thereby damaging a phase relation between the adjacent data clocks. Here, the plurality of repeaters includes the repeaters INV1_A, INV2_A, INV1_B, INV2_B, INV1_C, INV2_C, INV1_D, INV2_D for repeating the main internal clock IN_CLK and repeaters INVB1_A, INVB2_A, INVB1_B, INVB2_B, INVB1_C, INVB2_C, INVB1_D, and INVB2_D for repeating a sub internal clock IN_CLKB.

Since it is impossible for the devices included in the plurality of repeaters for repeating the data clocks generated by the multi-phase scheme to have the same size due to mismatch and skew occurring in a manufacturing process, the phase relation between data clocks generated by the multi-phase may be distorted by the generated jitter.

SUMMARY OF THE INVENTION

Embodiments of the present invention are directed to providing a semiconductor memory device for minimizing power consumption by removing repeaters included for transmitting clocks for inputting and outputting data having a relatively high frequency.

In accordance with an aspect of the present invention, there is provided a semiconductor memory device which includes a clock input for receiving a source clock and supplying a generated clock to a plurality of clock transmission lines; a plurality of clock amplifiers, each amplifying a respective generated clock loaded on one of the plurality of clock transmission lines in response to a column enable signal; and a data input/output for inputting/outputting a plurality of data in response to the amplified clocks output by the plurality of clock amplifiers.

In accordance with another aspect of the present invention, there is provided a semiconductor memory device including: a clock input for receiving a source clock, generating a plurality of internal clocks each having a frequency identical to the source clock and different phases from one another, and supplying the plurality of internal clocks to a plurality of clock transmission lines; a plurality of clock amplifiers for amplifying the plurality of internal clocks loaded on each of clock transmission lines in response to a column enable signal; a data input/output\for inputting/outputting a plurality of data in response to the amplified clocks output by the clock amplifiers.

DESCRIPTION OF SPECIFIC EMBODIMENTS

Hereinafter, a semiconductor memory device in accordance with the present invention will be described in detail with reference to the accompanying drawings.

Figure 2:
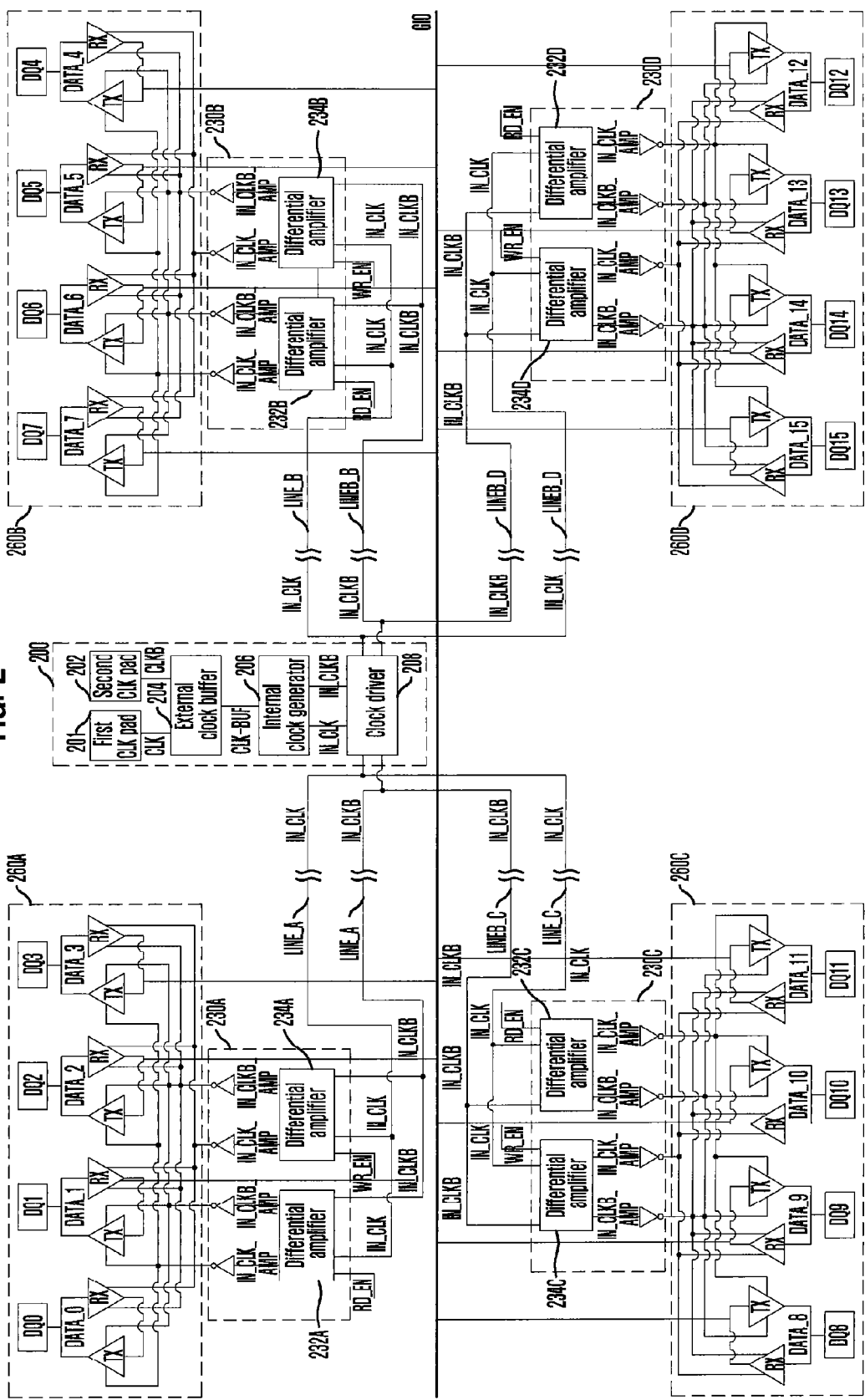
FIG. 2 is a circuit diagram illustrating a data clock transmission path for a synchronous semiconductor memory device in accordance with an embodiment of the present invention.

FIG. 2 is a circuit diagram illustrating a data clock transmission path for a synchronous semiconductor memory device in accordance with an embodiment of the present invention.

Referring to FIG. 2, the data clock transmission path according to the present embodiment includes a clock input unit 200, a plurality of clock amplifiers 230A, 230B, 230C, and 230D, and a plurality of data input/output units 260A, 260B, 260C, and 260D. The clock input unit receives external clocks CLK and CLKB input from an external device and loads the received external clocks CLK and CLKB on a plurality of clock transmission lines LINE_A, LINEB_µL LINE_B, LINEB_B, LINE_C, LINEB_C, LINE_D, and LINEB_D as internal clocks IN_CLK and IN_CLKB. The plurality of clock amplifiers 230A, 230B, 230C, and 230D amplify clocks loaded on each of the clock transmission lines LINE_A, LINEB_A, LINE_B, LINEB_B, LINE_C, LINEB_C, LINE_D, LINEB_D, LINE_A, LINEB_A, LINE_B, LINEB_B, LINE_C, LINEB_C, LINE_D, and LINEB_D in response to column enable signals RD_EN and WR_EN. The data input/output units 260A, 260B, 260C, and 260D input and output a plurality of data DATA0, DATA1, DATA2, DATA3, DATA4, DATA5, DATA6, DATA7, DATA8, DATA9, DATA10, DATA11, DATA12, DATA13, DATA14, and DATA15 in response to clocks IN_CLK_AMP, IN_CLKB_AMP output by the clock amplifiers 230A, 230B, 230C, and 230D.

The clock input unit 200 includes a clock buffer 204, an internal clock generator 206, and a clock driver 208. The clock buffer 204 receives the external clocks CLK and CLKB through clock input pads 201 and 202. The internal clock generator 206 generates internal clocks IN_CLK and IN_CLKB having a frequency identical to that of the external clock in response to the output clock CLK_BUF of the clock buffer 204. The clock driver 208 drives the internal clocks IN_CLK and IN_CLKB on each of the clock transmission lines LINE_A, LINEB_A, LINE_B, LINEB_B, LINE_C, LINEB_C, LINE_D, and LINEB_D.

The plurality of clock amplifiers 230A, 230B, 230C, and 230D include first clock amplifiers 234A, 234B, 234C, and 234D and second clock amplifiers 232A, 232B, 232C, and 232D, respectively. The first clock amplifiers 234A, 234B, 234C, and 234D amplify clocks loaded on each of clock transmission lines LINE_A, LINEB_A, LINE_B, LINEB_B, LINE_C, LINEB_C, LINE_D, and LINEB_D in response to a write enable signal WR_EN between the column enable signals RD_EN and WR_EN. The second clock amplifiers 232A, 232B, 232C, and 232D amplify clocks loaded on each of clock transmission lines LINE_A, LINEB_A, LINE_B, LINEB_B, LINE_C, LINEB_C, LINE_D, and LINEB_D in response to a read enable signal RD_EN.

The data input/output units 260A, 260B, 260C, and 260D include a data input unit RX and a data output unit TX. The data input unit RX loads a plurality of data DATA_0, DATA_1, DATA_2, DATA_3, DATA_4, DATA_5, DATA_6, DATA_7, DATA_8, DATA_9, DATA_10, DATA_11, DATA_12, DATA_13, DATA_14, and DATA_15, received through input/output pads DQ0, DQ1, DQ2, DQ3, DQ4, DQ5, DQ6, DQ7, DQ8, DQ9, DQ10, DQ11, DQ12, DQ13, DQ14, and DQ15, onto a global data line GIO in response to clocks IN_CLK_AMP and IN_CLKB_AMP output by the first clock amplifiers 234A, 234B, 234C, and 234D. The data output unit TX outputs a plurality of output data DATA_0, DATA_1, DATA_2, DATA_3, DATA_4, DATA_5, DATA_6, DATA_7, DATA_8, DATA_9, DATA_10, DATA_11, DATA_12, DATA_13, DATA_14, and DATA_15, which are loaded on the global data line (GIO), to a plurality of data input/output pads DQ0, DQ1, DQ2, DQ3, DQ4, DQ5, DQ6, DQ7, DQ8, DQ9, DQ10, DQ11, DQ12, DQ13, DQ14, and DQ15 in response to the clocks IN_CLK_AMP and IN_CLKB_AMP output by the second clock amplifiers 232A, 232B, 232C, and 232D.

The plurality of clock amplifiers 230A, 230B, 230C, and 230D may selectively have two structures.

Although not illustrated in FIG. 2, the first structure of the clock amplifiers 230A, 230B, 230C, and 230D is used when an internal clock is not divided by a multi-phase scheme (For reference, FIG. 2 illustrates a main internal clock IN_CLK and a sub internal clock IN_CLKB divided according to a multi-phase scheme in which they have a phase difference of 180°). The first structure of the clock amplifiers 230A, 230B, 230C, and 230D includes a plurality of level converters turned On/Off in response to column enable signals RD_EN and WR_EN in order to increase an electric potential difference between an activation level and an inactivation level of clocks loaded on each of clock transmission lines LINE_A, LINEB_A, LINE_B, LINEB_B, LINE_C, LINEB_C, LINE_D, and LINEB_D.

For example, the plurality of level converters convert an electric potential level of the clocks loaded on each of the clock transmission lines LINE_A, LINEB_A, LINE_B, LINEB_B, LINE_C, LINEB_C, LINE_D, and LINEB_D. That is, the plurality of level converters amplifies the clocks that are swinging approximately at a CML level to clocks that are swinging at a CMOS level. Herein, the CML level is 0.5V of an electric potential level between an activation level and an inactivation level and the CMOS level is 1.25V of an electric potential level between an activation level and an inactivation level.

A second structure of the clock amplifiers 230A, 230B, 230C, and 230D is mainly used when an internal clock is divided by a multi-phase scheme as illustrated in FIG. 2. The second structure includes a plurality of differential amplifiers 232A, 232B, 232C, 232D, 234A, 234B, 234C, and 234D turned On/Off in response to column enable signals RD_EN and WR_EN. Such a second structure receives a plurality of clocks loaded on a plurality of clock transmission lines LINE_A, LINEB_A, LINE_B, LINEB_B, LINE_C, LINEB_C, LINE_D, and LINEB_D, which are divided into two clocks IN_CLK and IN_CLKB having a contrary phase to each other, for differential amplification of the received clocks.

Figure 3:
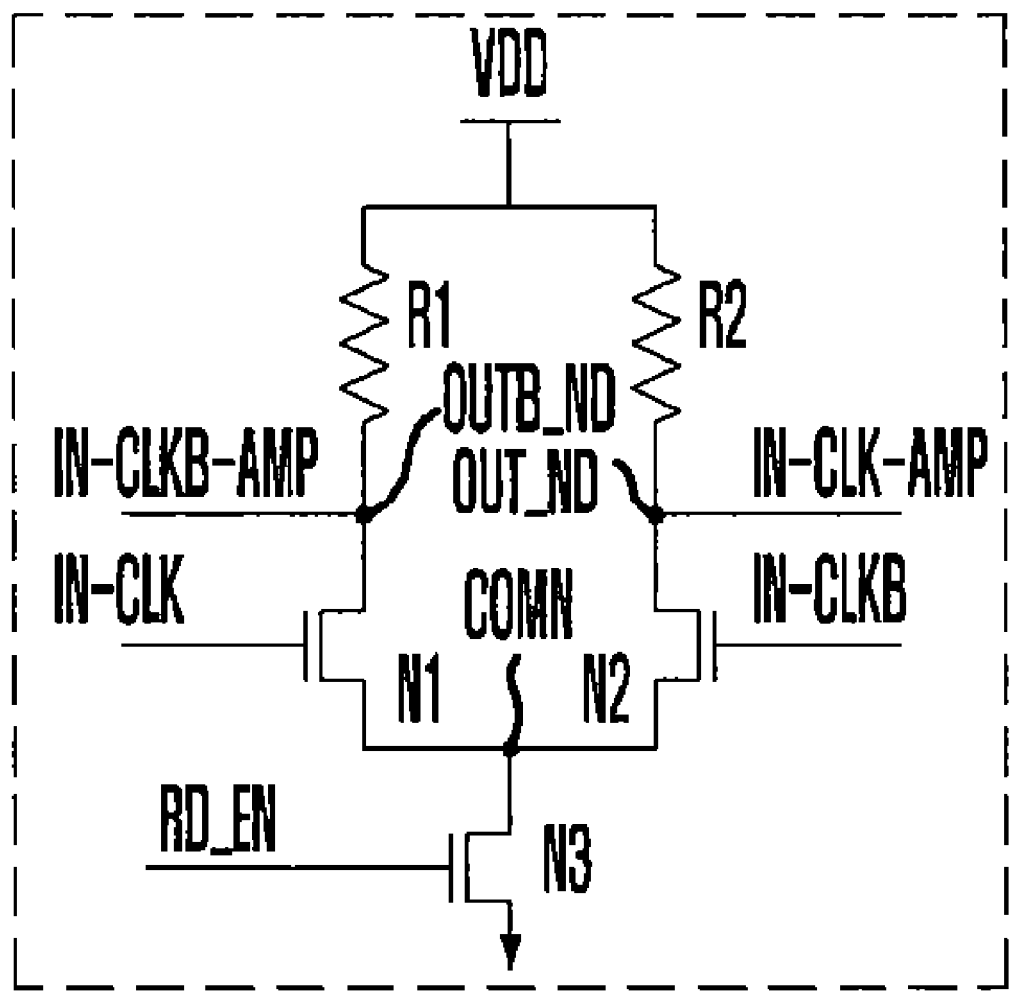
FIG. 3 is a circuit diagram illustrating the structure of the differential amplifiers included in FIG. 2.

FIG. 3 illustrates the structure of the differential amplifiers 232A, 232B, 232C, 232D, 234A, 234B, 234C, 234D, each of which includes first and second NMOS transistors N1 and N2, first and second resistances R1 and R2, and a third NMOS transistor N3. The first and second NMOS transistors N1 and N2 respectively receive a main internal clock IN_CLK and a sub internal clock IN_CLKB having a contrary phase to each other through a gate and control an amount of current flowing from a sub output end OUTB_ND and a main output end OUT_NB to a common node COMN. The first and second resistances R1 and R2 each have a fixed resistance value connected between a power voltage end VDD and the sub output node OUTB_ND or the main output end OUT_NB, respectively. The third NMOS transistor N3 controls an amount of current flowing from a drain-source connected common node COMN and a ground voltage VSS in response to a column enable signal WR_EN (not illustrated) or RD_EN applied to a gate.

Each of the differential amplifiers 232A, 232B, 232C, 233D, 234A, 234B, 234C, and 234D may differentially amplify clocks loaded on each of clock transmission lines LINE_A, LINEB_A, LINE_B, LINEB_B, LINE_C, LINEB_C, LINE_D, and LINEB_D. For example, each of the differential amplifiers amplifies the clocks that are swinging approximately at a CML level to clocks that are swinging at a CMOS level.

Hereinafter, the operation of a data clock transmission path in accordance with an embodiment of the present invention.

First, the clock input unit 200 supplies clocks CLK and CLKB input from an external device to a plurality of clock transmission lines LINE_A, LINEB_A, LINE_B, LINEB_B, LINE_C, LINEB_C, LINE_D, and LINEB_D. Coming from the external device, a main clock CLK and a sub clock CLKB having a contrary phase from the main clock are received using two clock input pads 201 and 202 as shown in FIG. 2. Although it is not illustrated in FIG. 2, alternatively one clock with a predetermined frequency and a predetermined phase may be received using one clock input pad.

For example, if the external clocks CLK and CLKB input from the external device have relatively high frequencies, a phase of the external clock is significantly changed by jitter between a device for generating the external clocks CLK and CLKB and the clock input unit 200 of the semiconductor memory device, even though only a small amount of jitter is generated at the external clocks CLK and CLKB due to noise in transferring the external clocks CLK and CLKB. The impact is pronounced because one cycle period of the external clocks CLK and CLKB has a relatively small value because the clock is at the relatively higher frequency. As a result, an original duty ratio or an original frequency of the external clocks CLK and CLKB may be disadvantageously changed.

It is possible to prevent the original duty ratio and the original frequency of the external clocks CLK and CLKB from being changed, by inputting a main clock CLK and a sub clock CLKB having contrary phases to each other and the same frequency. Although a small amount of jitter is generated at the external clocks CLK and CLKB due to noise in transferring the external clocks CLK and CLKB, a main clock CLK is corrected by a sub clock CLKB having contrary phases and the same frequency with the main clock CLK.

If the external clocks CLK and CLKB input from an external device have a relatively low frequency, the phases thereof are not as significantly changed between a device for generating the external clocks CLK and CLKB and the clock input unit 200 of the semiconductor memory device by jitter, although jitter is generated at the external clocks CLK and CLKB due to noise in transferring the external clocks CLK and CLKB. The effect of the jitter is diminished because one cycle period of the external clocks CLK and CLKB has a relatively large value due to the relatively low frequency. Therefore, an original duty ratio or an original frequency of the external clocks CLK and CLKB are not as easily changed.

Therefore, it is not necessary to simultaneously receive the main clock CLK and the sub clock CLKB having contrary phases to each other and the same frequency as shown in FIG. 2. That is, it is enough to receive one clock having a predetermined phase and a predetermined frequency.

Although the external clocks CLK and CLKB input from the external device have the relatively high frequency, it is not necessary to simultaneously receive the main clock CLK and the sub clock CLKB as shown in FIG. 2. Although the clocks CLK and CLKB input from the external device have the a relatively low frequency, it is also not necessary to receive only one clock. That is, it is optional according to a choice made by a designer.

The internal clock generator 206 of the clock input unit 200 is a phase locked loop (PLL). The internal clock generator 206 generates internal clocks IN_CLK and IN_CLKB using a buffering clock CLK_BUF provided via the external clock buffer 204 as a reference clock.

The operation of the internal clock generator 206 will be described. As described above, the clocks CLK and CLKB input from an external device have jitter generated due to noise. Here, the generated jitter component remains and is buffered although the external clocks CLK and CLKB are buffered through the external buffer 204 and output as an buffering clock CLK_BUF.

If the buffering clock CLK_BUF having a jitter component is applied to the data input unit RX and the data output unit TX without removing the jitter component and if the data input/output operation is performed based on the buffering clock CLK_BUF having the jitter component, data input/output errors may be disadvantageously generated.

For example, the larger the jitter component is, the smaller a setup/hold margin becomes when data is input through the data input unit RX. Therefore, invalid data may be received. When data is output through the data output unit TX, a data eye becomes reduced, where the data eye is a scale that denotes a period of valid data. Therefore, a receiver of the other semiconductor device such as a memory control unit (MCU) or a central processing unit (CPU) may have difficulty in properly receiving data.

Therefore, internal clocks CLK and CLKB having the same frequency as the buffering clock CLK_BLF, but without the jitter component which was included in the buffering clock CLK_BUF are generated by performing a phase locked loop (PLL) operation using the buffering clock CLK_BUF as a reference clock, instead of directly using the buffering clock CLK_BUF having the jitter component for a data input/output operation.

Here, the number of the internal clocks IN_CLK and IN_CLKB generated in the internal clock generator 206 may differ according to choices made by a designer. For example, two internal clocks IN_CLK and IN_CLKB having a contrary phase from each other, that is, a phase difference of 180°, may be generated as illustrated in FIG. 2. Although it is not illustrated in FIG. 2, four internal clocks each having a phase difference of 90° may be generated. That is, the internal clocks may be divided based on a multi-phase scheme.

As the frequencies of the external clocks CLK and CLKB increase, it is better to divide the internal clocks based on a multi-phase scheme. This is because a clock phase may be greatly influenced even by small jitter component when the clock has relatively high frequency, as described above. The jitter component may be generated while a clock is transmitted inside a semiconductor memory device. A clock having a relatively high frequency is greatly influenced by the jitter component. As a consequence, the phase thereof may be distorted.

Therefore, performing predetermined operations at edges of a clock having a relatively low frequency may be equivalent to performing predetermined operations at edges of a clock having a relatively high frequency, if the internal clocks IN_CLK and IN_CLKB are embodied based on a plurality of clocks where the plurality of clocks have a relatively low frequency with predetermined phase differences of multi-phase scheme. The clocks may not be adversely affected by jitter in the low frequency although the jitter is generated. Whereby, the predetermined operations at edges of a clock include a data input/ouput and the predetermined phase differences include 180°, 90°, and 45°.

A designer may select whether the internal clocks IN_CLK and IN_CLKB are divided in a multi-phase scheme or not. For example, when external clocks CLK and CLKB have a relatively low frequency, it is not necessary to generate the internal clocks in a multi-phase scheme.

The clock driving unit 208 loads the internal clocks IN_CLK and IN_CLKB generated from the internal clock generator 206 on each of the clock transmission lines LINE_A, LINEB_A, LINE_B, LINEB_B, LINE_C, LINEB_C, LINE_D, and LINEB_D. The data input unit RX and the data output unit TX connected to the data input/output pads DQ0, DQ1, DQ2, DQ3, DQ4, DQ5, DQ6, DQ7, DQ8, DQ9, DQ10, DQ11, DQ12, DQ13, DQ14, and DQ15 perform data input/output operations in response to the internal clocks IN_CLK and IN_CLKB.

That is, the data input unit RX and the data output unit TX are enabled to perform data input/output operations by supplying the internal clocks IN_CLK and IN_CLKB via each of the transmission lines LINE_A, LINEB_A, LINE_B, LINEB_B, LINE_C, LINEB_C, LINE_D, and LINEB_D and transmitting the clocks IN_CLK and IN_CLKB to the data input RX and the data output unit TX connected to each of the data input/output pads DQ0, DQ1, DQ2, DQ3, DQ4, DQ5, DQ6, DQ7, DQ8, DQ9, DQ10, DQ11, DQ12, DQ13, DQ14, and DQ15.

Figure 1:
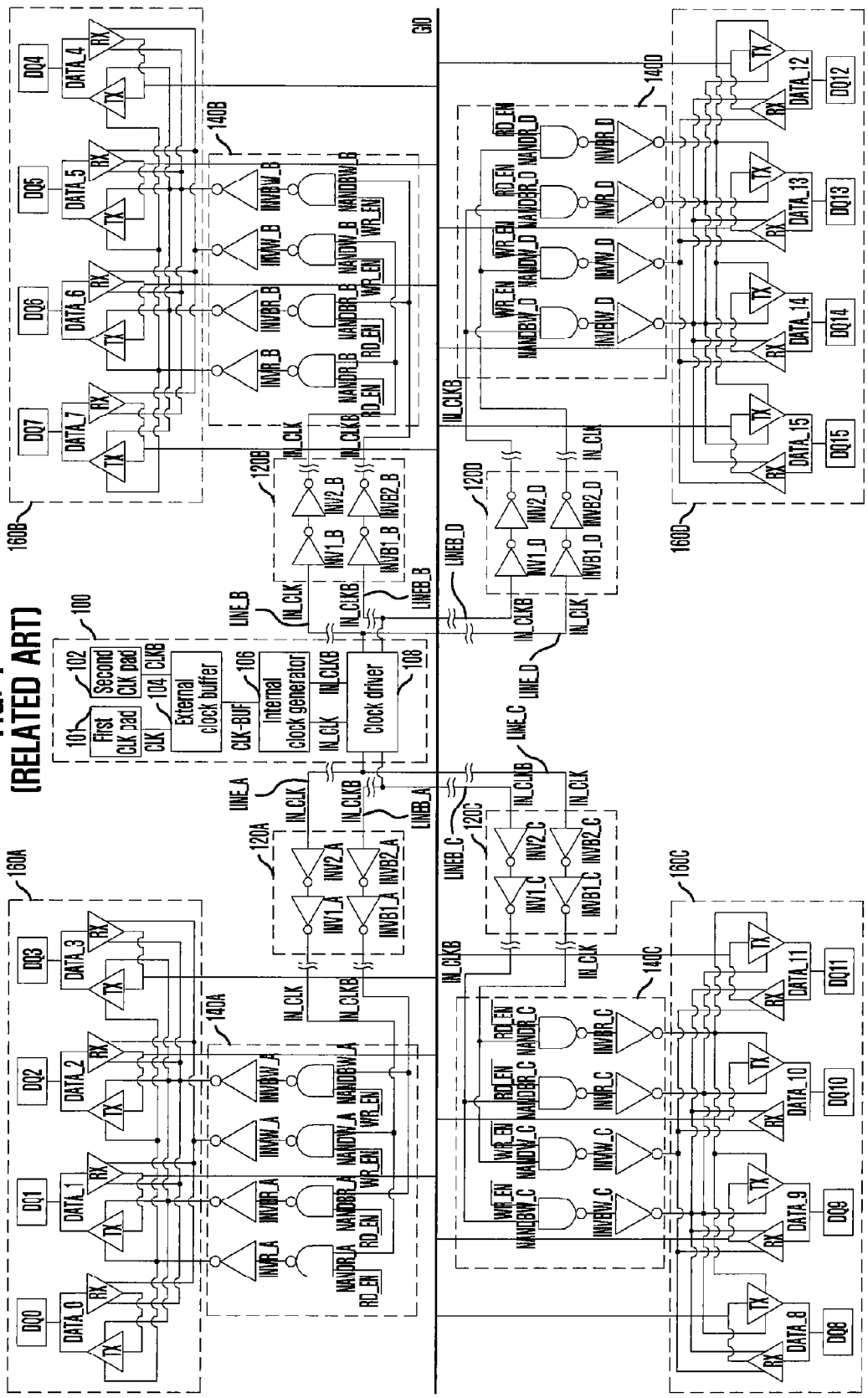
FIG. 1 is a circuit diagram showing a data clock transmission path according to the related art for a synchronous semiconductor memory device operating at a high speed.

The data clock transmission path according to the present embodiment includes a plurality of clock amplifiers 230A, 230B, 230C, and 230D instead of including a plurality of clock repeaters 120A, 120B, 120C, and 120D which were pointed as a cause of increasing power assumption in the data clock transmission path in the device shown in FIG. 1.

In the data clock transmission path according to the related art, the plurality of clock repeaters 120A, 120B, 120C, and 120D prevent attenuation of the electric potential level of internal clocks IN_CLK and IN_CLKB while being transferred on the clock transmission lines LINE_A, LINEB_A, LINE_B, LINEB_B, LINE_C, LINEB_C, LINE_D, and LINEB_D. Since such a plurality of clock repeaters 120A, 120B, 120C, and 120D are not included in the data clock transmission path according to the present embodiment, the electric potential level of the internal clocks IN_CLK and IN_CLKB is attenuated while passing through the clock transmission lines LINE_A, LINEB_A, LINE_B, LINEB_B, LINE_C, LINEB_C, LINE_D, and LINEB_D.

If a data input/output operation were performed using the internal clocks IN_CLK and IN_CLKB with the attenuated electric potential level in the data input unit RX and the data output unit TX connected to each of the data input/output pads DQ0, DQ2, DQ3, DQ4, DQ5, DQ6, DQ7, DQ8, DQ9, DQ10, DQ11, DQ12, DQ13, DQ14, and DQ15, to the units would not accurately input or output data.

Therefore, the plurality of clock amplifiers 230A, 230B, 230C, and 230D amplifies the internal clocks IN_CLK and IN_CLKB having the attenuated electric potential level before the internal clocks are input to the data input unit RX and the data output unit TX connected to each of the data input/output pads DQ0, DQ2, DQ3, DQ4, DQ5, DQ6, DQ7, DQ8, DQ9, DQ10, DQ11, DQ12, DQ13, DQ14, and DQ15, thereby preventing data input/output errors.

In the present embodiment, only one clock amplifier is supplied for each pair of the clock transmission lines LINE_μL, LINEB_A, LINE_B, LINEB_B, LINE_C, LINEB_C, LINE_D, and LINEB_D for amplifying the internal clock having the attenuated electric potential level. As a result, the number of transistors used in the data clock transmission path according to the present embodiment may be less than the number of transistors used in the data clock transmission path according to the related art.

Since the power consumption increases in the data clock transmission path in relation to the data clock transmission path including more transistors, the power consumption of the data clock transmission path according to the present embodiment is smaller than that of the data clock transmission path according to the related art.

Accordingly, jitter generated in a data clock passing the data clock transmission path according to the present embodiment may be smaller than that generated in a data clock passing the data clock transmission path according to the related art.

Since the clock amplifiers 230A, 230B, 230C, and 230D according to the present embodiment may be controlled to be turned On/Off in response to the column enable signals RD_EN and WR_EN, the clock amplifiers 230A, 230B, 230C and 230D effectively can perform the same operation as the clock repeaters 140A, 140B, 140C, and 140D.

The clock amplifiers 230A, 230B, 230C, and 230D control clocks loaded on each of the clock transmission lines LINE_A, LINEB_A, LINE_B, LINEB_B, LINE_C, LINEB_C, LINE_D, and LINEB_D to be transmitted to the data input/output units 260A, 260B, 260C, and 260D in response to the column enable signals RD_EN and WR_EN.

Therefore, when the clock amplifiers 230A, 230B, 230C, and 230D operate in response to one of the column enable signals RD_EN and WR_EN being activated, the clock amplifiers 230A, 230B, 230C, and 230D amplify clocks supplied on each of the clock transmission lines LINE_A, LINEB_A, LINE_B, LINEB_B, LINE_C, LINEB_C, LINE_D, and LINEB_D and transmit the amplified clocks to the data input/output units 260A, 260B, 260C, and 260D. When the clock amplifiers 230A, 230B, 230C, and 230D do not operate because the column enable signals RD_EN and WR_EN are inactivated, the clock amplifiers 230A, 230B, 230C, and 230D do not transmit clocks supplied on each of the clock transmission lines LINE_A, LINEB_A, LINE_B, LINEB_B, LINE_C, LINEB_C, LINE_D, and LINEB_D to the data input/output units 260A, 260B, 260C, and 260D.

According to the present embodiment, it is possible to minimize the number of transistors included in the data clock transmission path by removing repeaters that are disposed along each path for repeating the clocks in transmitting a data clock having relatively high frequency.

Since the number of transistors disposed in the data clock transmission path results in an amount of current being wasted in the data clock transmission path, it is also possible to minimize the amount of current wasted in the data clock transmission path by minimizing the number of the transistors in the data clock transmission path.

Since the amount of current wasted in the data clock transmission path corresponds to the amount of jitter generated in the data clock passing the data clock transmission path, it is also possible to minimize the jitter generated in the data clock by minimizing the amount of current wasted in the data clock transmission path.

If the jitter generated in the data clock is minimized, it is possible to more stably transmit the data clock through the data clock transmission path. Therefore, data input/output operations can be more stably performed in the semiconductor memory device in response to the data clock.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   a clock input for receiving a source clock and supplying a generated clock to a plurality of clock transmission lines;
   a plurality of clock amplifiers, each amplifying a respective generated clock loaded on one of the plurality of clock transmission lines in response to a column enable signal; and
   a data input/output for inputting/outputting a plurality of data in response to the amplified clocks output by the plurality of clock amplifiers.

2. The semiconductor memory device of claim 1, wherein the clock input includes:
   a clock buffer for receiving the source clock through a clock input pad and outputting a buffered source clock;
   an internal clock generator for generating an internal clock having a frequency and a phase substantially identical to the source clock in response to the buffered source clock; and
   a clock driver for driving the internal clock to each of clock transmission lines.

3. The semiconductor memory device of claim 1, wherein the clock amplifier includes:
   a first clock amplifier for amplifying the clocks supplied on each of the clock transmission lines in response to a write enable signal; and
   a second clock amplifier for amplifying the clocks supplied on each of the clock transmission lines in response to a read enable signal,
   wherein the write enable signal and the read enable signal is included in a column enable signal.

4. The semiconductor memory device of claim 3, wherein the data input/output includes:
   a data input for transmitting a plurality of input data input through a plurality of data input pads to a global data line in response to the amplified clocks output by the first clock amplifier; and
   a data output for outputting a plurality of output data supplied on the global data line to a plurality of data output pads in response to the amplified clocks output by the second clock amplifier.

5. The semiconductor memory device of claim 1, wherein the clock amplifiers include a plurality of level converters for increasing an electric potential level between an activation level and an inactivation level of the clocks loaded on each of the clock transmission lines in response to the column enable signal.

6. The semiconductor memory device of claim 1, wherein the clock amplifiers amplify the clocks loaded on each of the clock transmission lines, which are swinging approximately at a CML level, to a CMOS level in response to the column enable signal.

7. The semiconductor memory device of claim 1, wherein the each clock amplifier comprising:
   differential amplifier for amplifying differentially the clocks loaded on each of clock transmission lines and outputting the differentially amplified clocks.

8. A semiconductor memory device comprising:
   a clock input for receiving a source clock, generating a plurality of internal clocks each having a frequency identical to the source clock and different phases from one another, and supplying the plurality of internal clocks to a plurality of clock transmission lines;
   a plurality of clock amplifiers for amplifying the plurality of internal clocks loaded on each of clock transmission lines in response to a column enable signal; and
   a data input/output for inputting/outputting a plurality of data in response to the amplified clocks output by the clock amplifiers.

9. The semiconductor memory device of claim 8, wherein the clock input includes:
   a clock buffer for receiving a main clock and a sub clock having a phase contrary to each other respectively through a main clock input pad and a sub clock input pad, buffering the main clock and the sub clock, and outputting the buffered clocks as buffering clocks;
   an internal clock generator for generating the plurality of internal clocks each having a phase identical to the buffering clocks and different phases from each other in response to a buffering clock; and
   a clock driver for supplying the plurality of internal clocks generated to the plurality of clock transmission lines.

10. The semiconductor memory device of claim 8, wherein each of the clock amplifiers includes:
    a first clock amplifier for amplifying an internal clock loaded on a respective clock transmission line in response to a write enable signal; and
    a second clock amplifier for amplifying the internal clock loaded on of the respective clock transmission line in response to a read enable signal,
    wherein the write enable signal and the read enable signal is included in a column enable signal.

11. The semiconductor memory device of claim 10, wherein the data input/output includes:
    a data input for transferring an input data input through a data input pad to a global data line in response to an amplified clock output by the first clock amplifier; and
    a data output for outputting an output data supplied on the global data line to a data output pad in response to an amplified clock output by the second clock amplifier.

12. The semiconductor memory device of claim 8, wherein the clock amplifiers include a plurality of differential amplifiers for receiving the plurality of internal clocks supplied on the plurality of clock transmission lines as pairs of clocks having a contrary phase to each other and differentially amplifying each of the pairs of clocks in response to the column enable signal.

13. The semiconductor memory device of claim 8, wherein the clock amplifiers include a plurality of level converters for amplifying an electric potential level between an activation level and an inactivation level of the internal clocks loaded on each of clock transmission lines in response to the column enable signal.

14. The semiconductor memory device of claim 8, wherein each of the clock amplifiers amplify the internal clocks loaded on each of clock transmission lines, which are swinging approximately at a CML level, to a CMOS level in response to the column enable signal.

15. The semiconductor memory device of claim 8, wherein the each clock amplifier comprising:
    differential amplifier for amplifying differentially the clocks loaded on each of clock transmission lines and outputting the differentially amplified clocks.

* * * * *